(12) United States Patent
Chumakov

(10) Patent No.: US 8,541,311 B2
(45) Date of Patent: Sep. 24, 2013

(54) INTEGRATED CIRCUIT FABRICATION METHODS UTILIZING EMBEDDED HARDMASK LAYERS FOR HIGH RESOLUTION PATTERNING

(75) Inventor: Dmytro Chumakov, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 209 days.

(21) Appl. No.: 12/975,701

(22) Filed: Dec. 22, 2010

(65) Prior Publication Data

US 2012/0164836 A1    Jun. 28, 2012

(51) Int. Cl.
*H01L 21/311* (2006.01)

(52) U.S. Cl.
USPC ............. 438/702; 257/E21.038; 257/E21.235

(58) Field of Classification Search
USPC ................. 438/671, 700, 702, 703, 717, 719, 438/424, 551, 736; 257/E21.235, E21.038, 257/E21.039, E21.236
See application file for complete search history.

(56) References Cited

U.S. PATENT DOCUMENTS

| | | | |
|---|---|---|---|
| 6,221,777 B1 * | 4/2001 | Singh et al. | 438/692 |
| 6,867,116 B1 * | 3/2005 | Chung | 438/551 |
| 7,592,265 B2 * | 9/2009 | Wang et al. | 438/736 |
| 2003/0059992 A1 * | 3/2003 | Cotte et al. | 438/190 |
| 2005/0272259 A1 * | 12/2005 | Hong | 438/669 |
| 2007/0134909 A1 * | 6/2007 | Klee et al. | 438/620 |
| 2008/0054483 A1 * | 3/2008 | Lee et al. | 257/774 |
| 2008/0093710 A1 * | 4/2008 | Bach | 257/635 |
| 2008/0179281 A1 * | 7/2008 | Lee et al. | 216/41 |
| 2009/0152734 A1 * | 6/2009 | Smayling | 257/774 |
| 2010/0317194 A1 * | 12/2010 | Su et al. | 438/694 |

* cited by examiner

*Primary Examiner* — Matthew Landau
*Assistant Examiner* — Latanya N Crawford
(74) *Attorney, Agent, or Firm* — Ingrassia Fisher & Lorenz, P.C.

(57) ABSTRACT

Embodiments of a method for fabricating integrated circuits are provided. In one embodiment, the method includes the steps of depositing a dielectric layer over a semiconductor device, forming a plurality of trimmed hardmask structures at predetermined locations over the dielectric layer, embedding the plurality of trimmed hardmask structures in a surrounding hardmask layer, removing the plurality of trimmed hardmask structures to create a plurality of openings through the surrounding hardmask layer, and etching the dielectric layer through the plurality of openings to form a plurality of etch features therein.

13 Claims, 3 Drawing Sheets

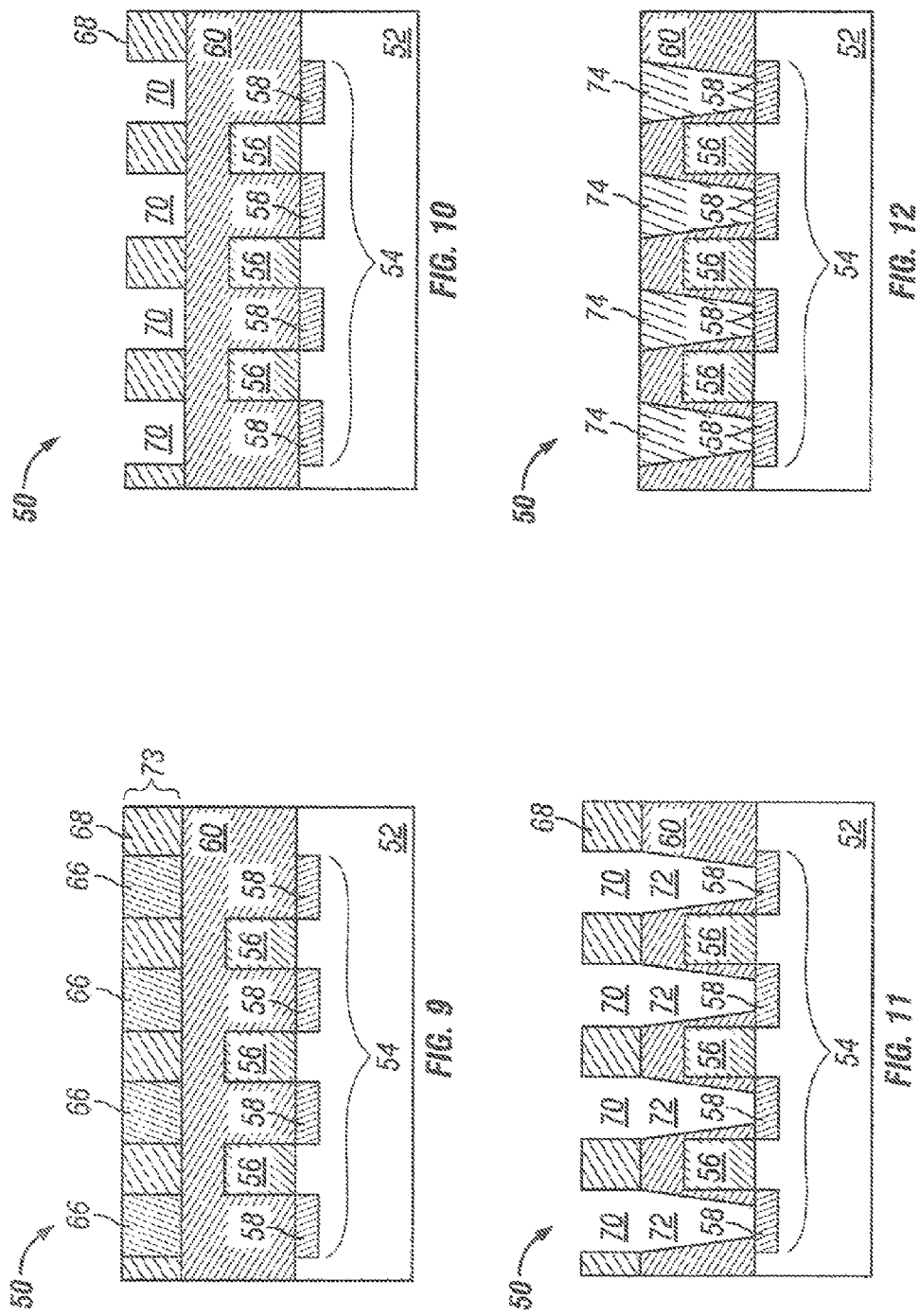

INTEGRATED CIRCUIT FABRICATION METHODS UTILIZING EMBEDDED HARDMASK LAYERS FOR HIGH RESOLUTION PATTERNING

TECHNICAL FIELD

The present invention relates generally to semiconductor device fabrication techniques and, more particularly, to methods for fabricating integrated circuits utilizing embedded hardmask layers to form high resolution etch features during Back End-of-the-Line processing.

BACKGROUND

During front end-of-the-line processing, a plurality of semiconductor devices (e.g., transistors, resistors, capacitors, and the like) are formed on a semiconductor wafer. During Back End-of-the-Line ("BEoL") processing, the semiconductor devices are interconnected to form a plurality of integrated circuits on the wafer, which are subsequently separated into individual die during wafer dicing. Interconnection of the semiconductor devices is accomplished via the formation of electrically-conductive features (e.g., conductive plugs and interconnect lines) in a plurality of dielectric layers successively deposited over the semiconductor devices during BEoL processing. For example, contact openings are etched in the first dielectric layer deposited directly over the semiconductor devices (commonly referred to as the "pre-metal dielectric layer"), a conductive material (e.g., tungsten) is deposited into the contact openings, and the excess conductive material is removed by chemical mechanical planarization to produce a plurality of conductive plugs embedded in the pre-metal dielectric layer and in ohmic contact with electrically-active contact features of the semiconductor devices (e.g., doped regions, gate electrodes, etc.). Similarly, during fabrication of the BEoL metal levels, contact openings and trenches are etched within intermetal dielectric layers, filled with a conductive material (e.g., copper), and planarized to yield a plurality of conductive plugs and interconnect lines electrically interconnecting the semiconductor devices of the integrated circuits.

Lithographical patterning techniques are conventionally utilized to create etch features in the dielectric layers formed during BEoL processing. However, conventional lithographical patterning techniques are inherently limited by resolution constraints. It can thus be difficult to reliably satisfy, within acceptable margins of error, circuit designs having relatively small critical dimensions and ultrafine pitch requirements (e.g., circuit designs for semiconductor generations equal to or less than 32 nm) utilizing conventional lithographical patterning techniques. As a specific example, during contact integration of an integrated circuit having closely spaced gates and contact features (e.g., doped regions), conventional lithographical patterning may be incapable of forming contact openings that are large enough to ensure reliable contact with the contact features of the semiconductor devices, while also reliably avoiding exposure of one or more of the gates through the pre-metal dielectric layer. If gate exposure occurs during contact etching, direct contact can occur between the exposed gate and the conducive metal with which the contact opening is filled. A short circuit may thus result, and overall wafer yield may be undesirably diminished. Although certain techniques have been developed to help reduce the risk of gate exposure during contact etching, such as imparting the contact openings with a tapered geometry and/or depositing an oxide shrinkage liner into the contact openings, such techniques add undesirable complexity, expense, and delay to BEoL processing and are not always effective at preventing gate exposure.

There thus exists an ongoing demand to provide embodiments of a patterning and etching technique capable of forming etch features in dielectric layers during BEoL processing at resolutions exceeding those attainable utilizing conventional lithographical patterning techniques. It would be particularly desirable to provide embodiments of a patterning method that could be utilized to form high resolution contact openings in a pre-metal dielectric layer to decrease the likelihood of gate exposure during contact integration and thereby increase overall product yield. More generally, it would be desirable to provide embodiments of a process for fabricating an integrated circuit that incorporates such a high resolution patterning method. Other desirable features and characteristics of the present invention will become apparent from the subsequent detailed description and the appended Claims, taken in conjunction with the accompanying Drawings and the foregoing Technical Field and Background.

BRIEF SUMMARY

Embodiments of a method for fabricating integrated circuits are provided. In one embodiment, the method includes the steps of depositing a dielectric layer over a semiconductor device, forming a plurality of trimmed hardmask structures at predetermined locations over the dielectric layer, embedding the plurality of trimmed hardmask structures in a surrounding hardmask layer, removing the plurality of trimmed hardmask structures to create a plurality of openings through the surrounding hardmask layer, and etching the dielectric layer through the plurality of openings to form a plurality of etch features therein.

BRIEF DESCRIPTION OF THE DRAWINGS

The present invention will hereinafter be described in conjunction with the following drawing figures, wherein like numerals denote like elements, and wherein:

FIGS. 5-12 are simplified cross-sectional views of an exemplary integrated circuit at various stages of manufacture and produced in accordance with an exemplary embodiment of the present invention.

DETAILED DESCRIPTION

Figure 1:
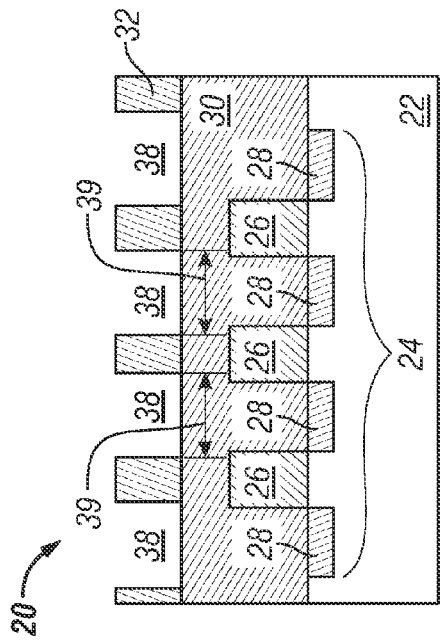
FIGS. 1-4 are simplified cross-sectional views of an exemplary integrated circuit at various stages of manufacture and produced in accordance with the teachings of prior art.

The following Detailed Description is merely exemplary in nature and is not intended to limit the invention or the application and uses of the invention. Furthermore, there is no intention to be bound by any expressed or implied theory presented in the preceding Technical Field, Background, Brief Summary, or the following Detailed Description.

Certain terminology may appear in the following Detailed Description for the purpose of reference only and is not intended to be limiting. For example, terms such as "upper," "lower," "above," and "below" refer to directions and relative orientations in the subsequently-referenced Drawings. These and similar terms may be utilized herein to describe the orientation and/or location of a feature or element within a consistent, but arbitrary frame of reference, which is made clear by reference to the text and the associated Drawings describing the component, device, and/or process under discussion. In this regard, the term "over," the term "overlying,"

and similar terms are utilized to indicate relative position between two structural elements or layers and not necessarily to denote physical contact between structural elements or layers.

The following describes exemplary embodiments of a semiconductor fabrication process and, specifically, exemplary embodiments of a method for creating high resolution etch features within one or more dielectric layers formed during Back End-of-the-Line ("BEoL") processing. As appearing herein, the phrase "etch features" denotes any opening or void formed in a dielectric layer utilizing one or more etching processes. Embodiments of the high resolution patterning method can be utilized to form contact openings in pre-metal dielectric layers deposited during the initial stages of BEoL processing commonly referred to as "contact integration." Such contact openings may then be filled with a conductive material to form conductive plugs in ohmic contact with electrically-active elements of the semiconductor devices, as described below. Embodiments of the high resolution patterning method can also be utilized to form contact openings, trenches, vias, and the like in the intermetal dielectric layers deposited during fabrication of the various metal levels of the integrated circuit. Such etch features may then be filled with a conductive material to form conductive plugs, interconnect lines, and other such electrically-conductive features that collectively interconnect the semiconductor devices to complete the integrated circuits prior to wafer dicing.

As a primary advantage, embodiments of the high resolution patterning method are capable of achieving etch features at resolutions far below those provided by conventional lithographical patterning processes. Consequently, embodiments of the high resolution patterning method described herein are especially well-suited for usage in conjunction with circuit designs having relatively demanding critical dimension and pitch requirements, as may commonly be the case for semiconductor generations equal to or less than 32 nm. As pitch and critical dimension design requirements tend to be the most exacting during contact integration, an exemplary embodiment is described below in conjunction with FIGS. 5-12 wherein the high resolution patterning method is utilized to form a plurality of contact openings in a pre-metal dielectric layer of an exemplary, simplified, partially-fabricated integrated circuit. For comparison purposes, a commonly-employed lithographical patterning and etching process is also described below in conjunction with FIGS. 1-4 in the context of contact integration. These examples notwithstanding, it is emphasized that embodiments of the high resolution patterning method can be utilized to create any type of etch feature (e.g., contact openings, trenches, vias, etc.) in any type of dielectric layer or dielectric layers (e.g., pre-metal dielectric and intermetal dielectric layers) formed during BEoL processing. Furthermore, various steps in the manufacture of integrated circuits are well-known and, in the interests of brevity, will only be mentioned briefly herein or will be omitted entirely without providing the well-known process details.

FIGS. 1-4 are simplified cross-sectional views of an exemplary integrated circuit 20 at various stages of manufacture during Back End-of-the-Line ("BEoL") processing and, specifically, during contact integration. Integrated circuit 20 includes a semiconductor substrate 22 (e.g., a bulk silicon wafer or a silicon-on-insulator wafer) over which a plurality of semiconductor devices 24 has been formed during Front End-of-the-Line Processing. Semiconductor devices 24 are generically illustrated in FIGS. 1-4 as including a plurality of gates 26 and a plurality of electrical contact points 28, which are interspersed with gates 26. Semiconductor devices 24 will also include other commonly-known structural elements that are not shown in FIGS. 1-4 for clarity (e.g., sidewall spacers). In the illustrated example, electrical contact points 28 assume the form of doped regions (e.g., source/drain regions) of semiconductor substrate 22; however, electrical contact points 28 may assume the form of other type of electrically-active elements included within semiconductor devices 24 (e.g., gate electrodes) or other electrically-active elements formed in the metal levels (e.g., metal interconnect lines) in alternative embodiments. Although integrated circuit 20 is not drawn to scale, gates 26 and electrical contact points 28 are intentionally represented in FIGS. 1-4 as having a relatively tight pitch to more clearly illustrate resolution limitations inherent in the conventionally-implemented lithographical patterning technique described below. As further shown in FIGS. 1-4, a pre-metal dielectric ("PMD") layer 30 is formed over semiconductor substrate 22, gates 26, and electrical contact points 28, and envelops or surrounds gates 26.

In accordance with one common lithographical patterning technique, a multi-layer lithographical stack is formed over the upper surface of PMD layer 30 immediately prior to patterning of layer 30. For example, as shown in FIG. 1, a tri-layer lithographical stack may be employed that includes: (i) an organic or optical planarizing layer ("OPL") 32 formed over PMD layer 30; (ii) an antireflective coating ("ARC") layer 34 formed over OPL 32, and (iii) a photoresist layer 36 formed over OPL 32. The material and depositions techniques utilized to form OPL 32, ARC layer 34, and photoresist layer 36 are well-known with the semiconductor industry and are consequently not described herein. Although not shown in FIGS. 1-4 for clarity, one or more etch stop layers (e.g., a nitride and/or oxide layer) may also be formed over PMD layer 30 prior to formation of the lithographical stack.

Figure 2:
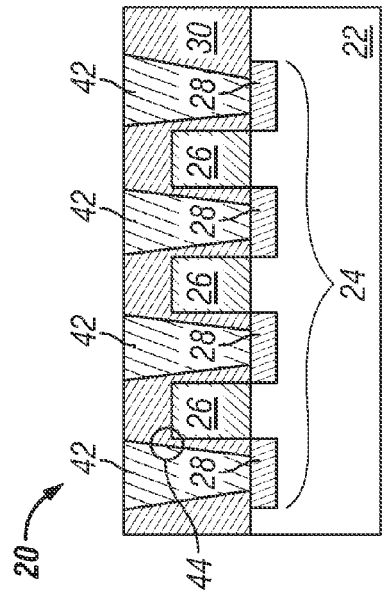

After formation of the lithographical stack, photoresist layer 36 is patterned by exposure to an image pattern and treated with a developing solution. One or more etching steps are then performed to transfer the pattern formed in photoresist layer 36 to ARC layer 34 and OPL 32, with photoresist layer 36 and ARC layer 34 typically being consumed in the process. As illustrated in FIG. 2, patterning of OPL 32 results in the formation of a plurality of OPL openings 38, which are vertically aligned with the locations at which the contact openings and the conductive plugs will ultimately be formed within PMD layer 30, as described below. To ensure that the conductive plugs formed within OPL openings 38 provide adequate contact with electrical contact points 28, it is desirable to impart openings 38 with sufficiently large dimensions. At the same time, the dimensions of OPL openings 38 should not be so large as to present a significant risk of exposure of one or more of gates 26 during etching of PMD 30. Due to lithographical resolution limits, it can be difficult to satisfy these two competing criteria. For this reason, openings 38 may each be imparted with a width greater than the lateral spacing between the neighboring gates 26 positioned below a given opening 38 (indicated in FIG. 2 by arrows 39), and a tapered etching process may then be utilized to avoid (or at least decrease the likelihood of) gate exposure during contact etching, as described below in conjunction with FIG. 3.

Figure 3:
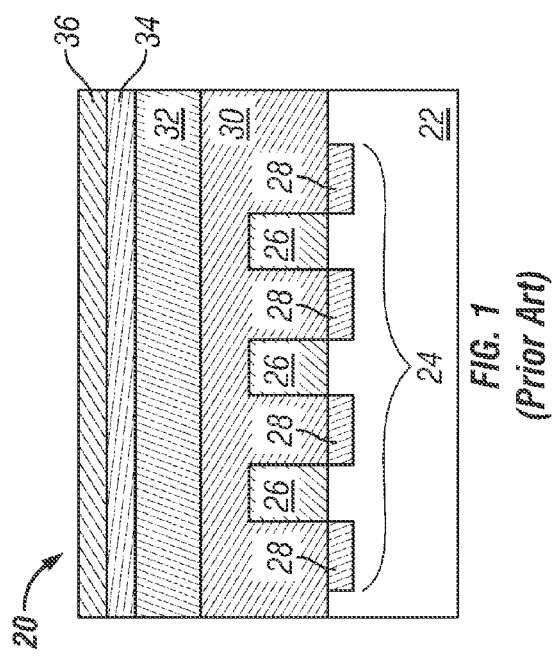

An anisotropic dry etch is performed to remove areas of PMD layer 30 exposed through OPL openings 38 and thereby create a plurality of contact openings 40 through layer 30. As shown in FIG. 3, contact openings 40 extend from the upper surface of PMD layer 30, through the body of layer 30, and to electrical contact points 28 of semiconductor devices 24. As previously stated, and as indicated in FIG. 3, the etching process may be controlled to impart each contact opening 40 with a tapered geometry to reduce the likelihood of gate exposure during contact etching. In one embodiment, a reactive ion etch ("RIE") is performed utilizing a chemistry selective to PMD layer 30, and flow of one or more plasma gases (e.g., oxygen flow) is manipulated during the RIE process to control the directional etch rate and thereby form contact openings having widths that gradually decrease with increasing proximity to semiconductor substrate 22.

Figure 4:
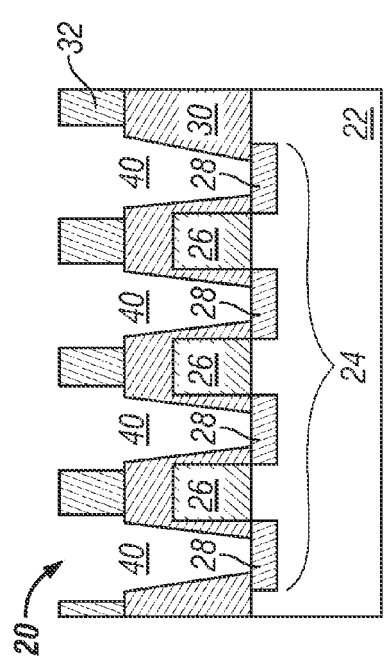

After formation of contact openings 40, OPL 32 is stripped by ashing, a conductive material (e.g., tungsten) is deposited into contact openings 40, and excess conductive material is removed utilizing a planarization process, such as chemical mechanical planarization ("CMP"). As shown in FIG. 4, this results in the formation of conductive plugs 42 embedded within PMD layer 30 and in ohmic contact with electrical contact points 28. As indicated in FIG. 4 by circle 44, the lateral spacing between the uppermost end of gates 26 and the sidewalls of conducive plugs 42 is relatively narrow. Consequently, one of or more of conductive plugs 42 may inadvertently be shorted to a neighboring gate 26 during contact metallization. The lithographical patterning and etching technique described above, and similar conventionally-known lithographical pattering techniques, thus present an undesirably high risk of short circuit, and therefore wafer yield loss, when utilized to form high resolution contact openings. To mitigate this risk, an exemplary embodiment of a method for forming high resolution etch features (e.g., contact openings) will now be described, which, in the specific case of contact integration, can be utilized to increase the lateral spacing between the gates and conductive plugs and thereby reduce the likelihood of short circuit during BEoL fabrication.

FIGS. 5-12 are simplified cross-sectional views of an exemplary integrated circuit 50 at various stages of manufacture during Back End-of-the-Line ("BEoL") processing and, specifically, during contact integration. In a general sense, integrated circuit 50 is similar to integrated circuit 20 described above in conjunction with FIGS. 1-4; e.g., as was the case previously, integrated circuit 50 includes a semiconductor substrate 52 having a plurality of semiconductor devices 54 formed thereon. Semiconductor substrate 52 may assume the form of any substrate on or in which semiconductor devices can be fabricated including, but not limited to, type IV semiconductor materials, as well as type III-V and II-VI semiconductor materials, organic semiconductors, and combinations thereof, whether in bulk single crystal, polycrystalline form, thin film form, semiconductor-on-insulator form, or combinations thereof. Semiconductor devices 54 are illustrated in FIGS. 5-12 in a simplified form as including a plurality of gates 56 and a plurality of electrical contact points 58, which are interspersed with gates 56; however, it will readily be appreciated that devices 54 can include various other commonly-known structural elements, such as sidewall spacers. As was the case previously, electrical contact points 58 assume the form of doped regions (e.g., source/drain regions) of semiconductor substrate 52 in the illustrated example; however, electrical contact points 58 may assume the form of any electrically-active element formed on semiconductor device 22 (e.g., gate electrodes) or within a dielectric layer formed during BEoL processing (e.g., a metal interconnect line formed in an intermetal dielectric layer of a given metal level). A pre-metal dielectric ("PMD") layer 60 overlies semiconductor substrate 22 and envelops or surrounds gates 56. One or more etch stop layers may be formed over PMD layer 60 in certain embodiments, but are not shown in FIGS. 5-12 for clarity.

Figure 5:
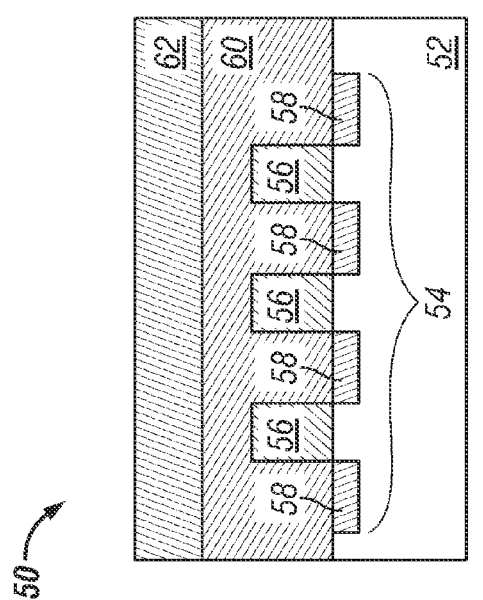

Referring initially to FIG. 5, the exemplary high resolution patterning method commences with the deposition of a trimmable hardmask layer 62 over the upper surface of PMD layer 60. Materials suitable for forming trimmable hardmask layer 62 include, but are not limited to, polycrystalline silicon ("polysilicon"), amorphous carbon, and nitride. Of the foregoing materials, polysilicon is a generally preferred in view of its relatively low cost, widespread availability, and amenability to selective etching processes of the type described below. Trimmable hardmask layer 62 may be blanket deposited over PMD layer 60 utilizing a chemical vapor deposition technique, such as low pressure chemical vapor deposition (LPCVD) or plasma enhanced chemical vapor deposition (PECVD) technique, performed with a silicon source material, such as silane or dichlorosilane. Alternatively, trimmable hardmask layer 62 can be applied over PMD layer 60 utilizing a spin-on technique. Trimmable hardmask layer 62 is preferably deposited to a thickness sufficient to maintain a substantial portion of its vertical bulk through the trimming process described below in conjunction with FIG. 7. In one embodiment, trimmable hardmask layer 62 is deposited to a thickness between approximately 100 nm and approximately 300 nm.

Figure 6:
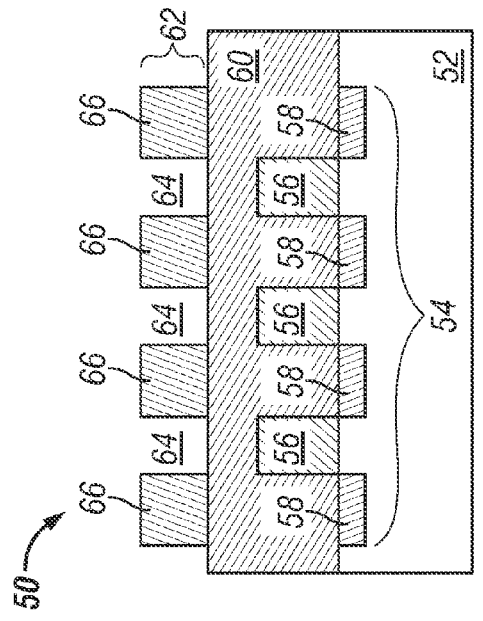

Trimmable hardmask layer 62 is next patterned to form a plurality of openings and thereby define a plurality of intermediate hardmask blocks or structures 66 separated by a plurality of gaps 64 (shown in FIG. 6). As described below in conjunction with FIG. 7, the dimensions of trimmable hardmask gaps 64 will be fine tuned by trimming to achieve the desired critical dimensions prior to etching of PMD layer 60; thus, high resolution patterning of trimmable hardmask layer 62 is not required, and patterning can be carried-out utilizing conventionally-known lithographical patterning and etching techniques. In this regard, any number and combination of lithographical layers may be utilized in the patterning of layer 62 including, for example, a tri-layer lithographical stack similar to that described above in conjunction with FIGS. 1-4. Etching of trimmable hardmask layer 62 is conveniently carried-out utilizing an RIE process with a chemistry selective to layer 62. For example, if trimmable hardmask layer 62 is formed from polysilicon, mixtures and/or sequences of difluoromethane ($CH_2F_2$), sulfur tetrafluoride ($SF_4$), sulfur hexafluoride ($SF_6$), and hydrogen bromide-based (HBr-based) chemistries can be utilized; if layer 62 is formed from amorphous carbon, mixtures and/or sequences of oxygen ($O_2$) and hydrogen bromide-based (HBr-based) chemistries can be utilized; and, if layer 62 is formed from nitride, mixtures and/or sequences of difluoromethane ($CH_2F_2$), fluoroform ($CHF_3$), nitrogen ($N_2$), and argon-based (Ar-based) chemistries can be utilized.

After initial patterning of trimmable hardmask layer 62, one or more trimming steps are performed to achieve the desired critical dimensions of intermediate hardmask structures 66. During the trimming process, gaps 64 are widened, while intermediate hardmask structures 66 are narrowed. Trimming processes suitable for usage at this juncture in the high resolution patterning process are known in conjunction with gate trimming processes. Notably, trimming processes are highly controllable and are consequently capable of narrowing intermediate hardmask structures 66 to the desired critical dimension with considerable precision. In a preferred embodiment, at least one plasma trimming process is utilized to narrow intermediate hardmask structures 66 (FIG. 6). The chemistry employed during the plasma trimming process is preferably chosen to achieve a high selectively favoring removal of the material from which intermediate hardmask structures 66 (FIG. 6) is formed over the material from which PMD layer 60 is formed. Non-exhaustive lists of suitable chemistries for embodiments wherein intermediate hardmask structures 66 are formed from certain preferred materials (i.e., polysilicon, amorphous carbon, or nitride) have been set-forth above in conjunction with FIG. 6. As may be appreciated by comparing the heights of hardmask structures 66 shown in FIG. 6 to the heights of hardmask structures 66 shown in FIG. 7, vertical bulk is also removed from structures 66 during the trimming process. Now trimmed to their final dimensions, intermediate hardmask structures 66 will be referred hereafter as "trimmed hardmask structures 66." The foregoing steps of depositing a trimmable hardmask layer, patterning the layer, and then trimming the resulting hardmask structures or blocks thus result in the formation of a plurality of trimmed hardmask structures (i.e., structures 66) at predetermined locations over the dielectric layer (i.e., PMD layer 60).

Figure 7:
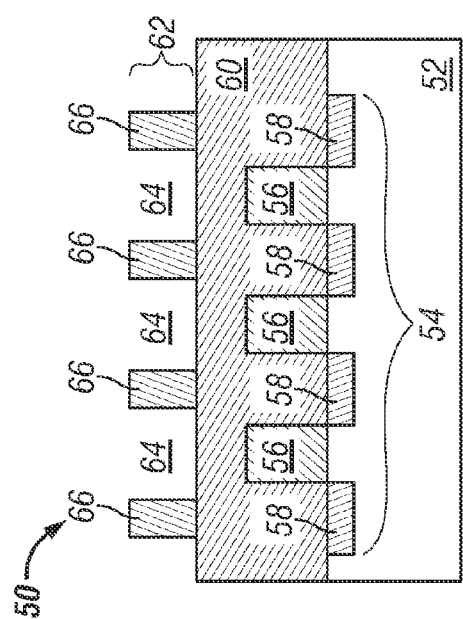
Figure 8:
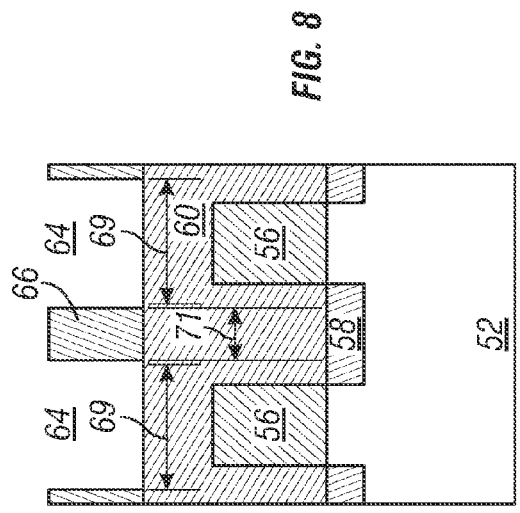

FIG. 8 is a more detailed view of a portion of partially-fabricated integrated circuit 50 shown in FIG. 7 after trimming of hardmask structures 66 (only one of which is shown in FIG. 8). As can be seen in FIG. 8, each trimmed hardmask structure 66 overlies (i.e., is vertically aligned with) a corresponding electrical contact point 58, as taken along an axis substantially orthogonal to the upper surface of semiconductor substrate 52. In addition, as indicated in FIG. 8 by arrow 71, each trimmed hardmask structure 66 is preferably trimmed to a width that is less than the width of the underlying electrical contact point 58. By comparison, hardmask gaps 64 each overly a different one of gates 56, and each preferably have a final width exceeding that of its underlying gate (indicated in FIG. 8 by arrows 69).

Turning to FIG. 9, hardmask structures 66 are next embedded in a surrounding hardmask layer 68. A second hardmask material is deposited over trimmed hardmask structures 66 and into trimmable hardmask gaps 64 to generally encapsulate structures 66 and fill gaps 64. In one embodiment, the second hardmask material is blanket deposited over hardmask structures 66 utilizing a spin-on technique, and excess material is removed utilizing a planarizing technique (e.g., CMP) to expose hardmask structures 66 through the upper surface of surrounding hardmask layer 68. After planarization, the thickness of hardmask structures 66 and surrounding hardmask layer 68 may be, for example, approximately 100 nm to approximately 200 nm. Collectively, trimmed hardmask structures 66 and surrounding hardmask layer 68 form a composite hardmask layer 73 containing a plurality of selectively-etchable features (i.e., trimmed hardmask structures 66) positioned over electrical contact points 58. Stated differently, composite hardmask layer 73 is formed to include a surrounding hardmask layer (i.e., layer 68) in which a plurality of selectively-etchable features (i.e., trimmed hardmask structures 66) is embedded, with each of the plurality of selectively-etchable features overlying a different one of electrical contact points 58. The material deposited to form surrounding hardmask layer 68 will be chosen based, at least in part, on the material from which trimmed hardmask structures 66 are formed. Generally, it is desirable to produce surrounding hardmask layer 68 from a material that will retain its bulk through etching of structures 66 (described below in conjunction with FIG. 10), while also being fairly easy to deposit over trimmed hardmask structures 66 and to planarize. In a preferred embodiment, surrounding hardmask layer 68 is formed from an organic planarizing material. Suitable organic planarizing materials include, but are not limited to, NFC series, HM series, or Shin Etsu ODL series planarizing materials commercially available from the JSR Corporation headquartered in Tokyo, Japan.

After embedding trimmed hardmask structures 66 in surrounding hardmask layer 68 in the above-described manner, an etch is performed to remove structures 66 and thereby form a plurality of hardmask openings 70 through layer 68 (shown in FIG. 10). Either a wet or dry etching process may be utilized, providing that the etch chemistry is selective to trimmed hardmask structures 66 over surrounding hardmask layer 68. Notably, in embodiments wherein trimmed hardmask structures 66 are formed from polysilicon, a highly selective etch can be performed utilizing mixtures and/or sequences of difluoromethane ($CH_2F_2$), sulfur tetrafluoride ($SF_4$), sulfur hexafluoride ($SF_6$), and hydrogen bromide-based (HBr-based) chemistries. In embodiments wherein structures 66 are formed from amorphous carbon, mixtures and/or sequences of oxygen ($O_2$) and hydrogen bromide-based (HBr-based) chemistries can be employed during the selective etching process. As a final example, in embodiments wherein structures 66 are formed from nitride, mixtures and/or sequences of difluoromethane ($CH_2F_2$), fluoroform ($CHF_3$), nitrogen ($N_2$), and argon-based (Ar-based) chemistries can be employed during the selective etching process.

At this juncture in the high resolution partnering process, a plurality of etch features (i.e., hardmask openings 70) has been formed through surrounding hardmask layer 68. Hardmask openings 70 (FIG. 10) are similar to OPL openings 38 shown and described above in conjunction with FIG. 2, but with pitch and critical dimension resolutions far below those attainable with conventional lithographical patterning techniques. With reference to FIG. 11, the portions of PMD layer 60 exposed through hardmask openings 70 can now be removed by etching without significant risk of exposing gates 56 through layer 60; e.g., the exposed portions of PMD layer 60 may be removed utilizing an RIE process selective to PMD 60, as previously described. Etching of PMD 60 results in the formation of a plurality of contact openings 72 extending from the upper surface of PMD layer 60, through layer 60, and to electrical contact points 58 of semiconductor devices 52. If desired, contact openings 72 may be imparted with a tapered geometry, as generally shown in FIG. 11; however, this is by no means necessary. Conventional steps are then performed to complete the fabrication of integrated circuit 50; e.g., as indicated in FIG. 12, surrounding hardmask layer 68 may be removed by ashing, and a conductive material (e.g., tungsten) may be deposited into contact openings 72 to form a plurality of conducive plugs 74 in ohmic contact with electrical contact points 58 of semiconductor devices 54.

There thus has been provided an exemplary embodiment of a patterning method capable of forming etch features in dielectric layers during BEoL processing at resolutions exceeding those attainable utilizing conventional lithographical patterning techniques. More broadly, there has been provided embodiments of a process for fabricating an integrated circuit utilizing such a high resolution patterning method. While primarily described above in the exemplary context of contact integration, embodiments of the high resolution patterning method can be utilized to create any type of etch feature (e.g., contact openings, trenches, vias, etc.) in any type of dielectric layer or dielectric layers (e.g., pre-metal dielectric and intermetal dielectric layers) formed during BEoL processing. It will be appreciated that certain conventionally-known steps (e.g., cleaning steps, deposition of seed layers, deposition of seed layers, etc.) have been omitted from the foregoing description and figures in the interests of brevity.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing the exemplary embodiment or exemplary embodiments. It should be understood that various changes can be made in the function and arrangement of elements without departing from the scope of the invention as set forth in the appended Claims and the legal equivalents thereof.

What is claimed is:

1. A method for fabricating an integrated circuit, comprising:
  depositing a dielectric layer over a semiconductor device;
  forming a plurality of trimmed hardmask structures at predetermined locations over the dielectric layer, wherein forming the plurality of trimmed hardmask structures comprises:
    depositing a trimmable hardmask layer over the dielectric layer including depositing polycrystalline silicon over the dielectric layer;
    patterning the trimmable hardmask layer to form a plurality of intermediate hardmask structures; and
    trimming the plurality of intermediate hardmask structures using a trimming process that selectively removes polycrystalline silicon over the dielectric layer to produce a plurality of trimmed hardmask structures over the dielectric layer;
  embedding the plurality of trimmed hardmask structures in a surrounding hardmask layer, wherein embedding the plurality of trimmed hardmask structures in the surrounding hardmask layer comprises depositing an organic planarizing layer over the plurality of trimmed hardmask structures;
  removing the plurality of trimmed hardmask structures to create a plurality of openings through the surrounding hardmask layer; and
  etching the dielectric layer through the plurality of openings to form a plurality of etch features in the dielectric layer.

2. A method according to claim 1 wherein trimming the plurality of intermediate hardmask structures comprises plasma trimming the plurality of intermediate hardmask structures.

3. A method according to claim 1 further comprising planarizing the surrounding hardmask layer after embedding the plurality of trimmed hardmask structures therein to expose the plurality of trimmed hardmask structures through the upper surface of the surrounding hardmask layer.

4. A method according to claim 1 wherein depositing the dielectric layer over the semiconductor device comprises depositing a pre-metal dielectric layer over a semiconductor device.

5. A method according to claim 4 wherein the step of etching the dielectric layer through the plurality of openings comprises removing portions of the pre-metal dielectric layer through the plurality of openings to form a plurality of contact openings in the pre-metal dielectric layer.

6. A method according to claim 4 wherein the semiconductor device includes a gate, and wherein forming the plurality of trimmed hardmask structures comprises forming two trimmed hardmask structures separated by a gap, the gap positioned over the gate and having a width exceeding the width of the gate.

7. A method according to claim 5 wherein the semiconductor device includes at least one electrical contact point, and wherein forming the plurality of trimmed hardmask structures at the predetermined locations over the dielectric layer comprises forming a trimmed hardmask structure at one of the predetermined locations on the pre-metal dielectric layer overlying the electrical contact point.

8. A method according to claim 7 wherein the step of forming the trimmed hardmask structure at one of the predetermined locations on the pre-metal dielectric layer comprises forming the trimmed hardmask structure to have a width less than the width of the electrical contact point.

9. A method for fabricating an integrated circuit, comprising:
  depositing a dielectric layer over a plurality of electrical contact points of the integrated circuit;
  forming a composite hardmask layer over the dielectric layer, the composite hardmask layer comprising a surrounding hardmask layer in which a plurality of selectively-etchable features is embedded, each of the plurality of selectively-etchable features overlying a different one of the plurality of electrical contact points, and wherein forming the composite hard mask layer comprises:
    forming a trimmable hardmask layer over the dielectric layer including depositing polycrystalline silicon over the dielectric layer;
    lithographically patterning the trimmable hardmask layer including patterning the trimmable hardmask layer to form a plurality of intermediate hardmask structures;
    trimming the plurality of intermediate hardmask structures using a trimming process that selectively removes polycrystalline silicon over the dielectric layer to produce a plurality of trimmed hardmask structures over the dielectric layer, wherein the plurality of trimmed hard mask structures are the selectively-etchable features defined as a plurality of polycrystalline silicon blocks; and
    depositing the surrounding hardmask layer over the selectively-etchable features including depositing an organic planarizing layer over the plurality of polycrystalline silicon blocks such that the plurality of polycrystalline silicon blocks are embedded in the organic planarizing material;
  removing the plurality of selectively-etchable features to create a plurality of openings through the surrounding hardmask layer; and
  etching the dielectric layer through the plurality of openings to form a plurality of etch features in the dielectric layer.

10. A method for fabricating an integrated circuit, comprising:
  fabricating a plurality of semiconductor devices including a plurality of electrical contact points;
  depositing a dielectric layer over the plurality of electrical contact points;
  forming a trimmable hardmask layer over the dielectric layer including depositing polycrystalline silicon over the dielectric layer;
  lithographically patterning the trimmable hardmask layer to define a plurality of intermediate hardmask structures;
  trimming the plurality of intermediate hardmask structures using a trimming process that selectively removes polycrystalline silicon over the dielectric layer to produce a plurality of trimmed hardmask structures each overlying a different one of the electrical contact points;
  depositing an organic planarizing layer over the trimmed hardmask structures;
  planarizing the organic planarizing layer to expose the trimmed hardmask structures;

removing the trimmed hardmask structures to form a plurality of openings in the organic planarizing layer; and etching the dielectric layer through the plurality of openings to form a plurality of etch features in the dielectric layer.

11. A method according to claim 10 wherein the step of removing the trimmed hardmask structures comprises performing a reaction ion etch with a chemistry selective to polycrystalline silicon to remove the trimmed hardmask structures from the organic planarizing layer.

12. A method according to claim 10 wherein the plurality of semiconductor devices includes a plurality of gates, and wherein trimming the plurality of intermediate hardmask structures comprises trimming the plurality of intermediate hardmask structures to produce a plurality of trimmed hardmask structures separated by a plurality of gaps, each of the plurality of gaps overlying a different one of the plurality of gates.

13. A method according to claim 12 wherein trimming the plurality of intermediate hardmask structures comprises trimming the plurality of intermediate hardmask structures to produce a plurality of trimmed hardmask structures separated by a plurality of gaps, each gap having a width greater than the width of its underlying gate.

* * * * *